US007366966B2

(12) United States Patent
LeBerge

(10) Patent No.: US 7,366,966 B2
(45) Date of Patent: Apr. 29, 2008

(54) SYSTEM AND METHOD FOR VARYING TEST SIGNAL DURATIONS AND ASSERT TIMES FOR TESTING MEMORY DEVICES

(75) Inventor: Paul A. LeBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 237 days.

(21) Appl. No.: 11/248,724

(22) Filed: Oct. 11, 2005

(65) Prior Publication Data
US 2007/0083800 A1    Apr. 12, 2007

(51) Int. Cl.
    G11C 29/00    (2006.01)
(52) U.S. Cl. ...................... 714/718; 714/745
(58) Field of Classification Search .............. 714/718, 714/745
    See application file for complete search history.

(56) References Cited

U.S. PATENT DOCUMENTS

| | | | | |
|---|---|---|---|---|
| 3,124,705 | A * | 3/1964 | Gray, Jr. .................... 327/141 |
| 4,675,546 | A * | 6/1987 | Shaw ........................ 327/176 |
| 4,779,221 | A | 10/1988 | Magliocco et al. ......... 364/900 |
| 4,809,221 | A | 2/1989 | Magliocco et al. ......... 364/900 |
| 5,086,280 | A * | 2/1992 | Ohmura et al. ............. 327/170 |
| 5,191,336 | A | 3/1993 | Stephenson ................ 341/111 |
| 5,453,995 | A * | 9/1995 | Behrens ...................... 714/743 |
| 5,552,733 | A * | 9/1996 | Lesmeister .................. 327/295 |
| 6,111,445 | A | 8/2000 | Zerbe et al. ................ 327/231 |
| 6,133,773 | A | 10/2000 | Garlepp et al. ............. 327/247 |
| 6,137,749 | A | 10/2000 | Sumner ....................... 368/113 |
| 6,198,327 | B1 * | 3/2001 | Takahashi ................... 327/291 |
| 6,247,138 | B1 | 6/2001 | Tamura et al. .............. 713/600 |
| 6,271,682 | B1 * | 8/2001 | Lindsay ........................ 326/93 |
| 6,289,468 | B1 * | 9/2001 | Godfrey ..................... 713/401 |
| 6,313,681 | B1 * | 11/2001 | Yoshikawa .................. 327/277 |
| 6,340,909 | B1 | 1/2002 | Zerbe et al. ................ 327/246 |
| 6,359,486 | B1 | 3/2002 | Chen .......................... 327/231 |
| 6,359,897 | B1 | 3/2002 | Hessel et al. ............... 370/429 |
| 6,484,268 | B2 | 11/2002 | Tamura et al. ............. 713/600 |
| 6,675,272 | B2 | 1/2004 | Ware et al. ................. 711/167 |
| 6,707,727 | B2 | 3/2004 | Tamura et al. ............. 365/192 |
| 6,791,360 | B2 | 9/2004 | Gauthier et al. ............. 326/93 |
| 6,815,986 | B2 | 11/2004 | Roy et al. ................... 327/149 |
| 6,861,877 | B2 * | 3/2005 | Shiah .......................... 327/34 |
| 6,895,523 | B2 * | 5/2005 | Otsuka ....................... 713/401 |
| 6,900,676 | B1 | 5/2005 | Tamura ...................... 327/156 |
| 6,950,956 | B2 | 9/2005 | Zerbe et al. ................ 713/400 |

(Continued)

Primary Examiner—Jacques Louis-Jacques
Assistant Examiner—Steve Nguyen
(74) Attorney, Agent, or Firm—Dorsey & Whitney LLP

(57) ABSTRACT

A testing system includes a phase interpolator receiving a clock signal. An output of the phase interpolator is coupled to both a first signal distribution tree that includes a first delay line in each of its branches and a second signal distribution tree that includes a second delay line in each of its branches, thereby producing respective first and second delayed clock signals. A test signal generator generates a plurality of test signals that may simulate memory command or address signal. A multiplexer couples the test signals to first and second inputs of a transmitter in a normal test mode but to only the first input in a special test mode. The transmitter outputs the signal applied to its first input responsive to the first delayed clock signal and it outputs the signal applied to its second input responsive to the second delayed clock signal.

34 Claims, 8 Drawing Sheets

U.S. PATENT DOCUMENTS

| | | |
|---|---|---|
| 6,958,640 B2 | 10/2005 | Lee et al. .................... 327/261 |
| 6,970,029 B2 | 11/2005 | Patel et al. ................. 327/261 |
| 2001/0007136 A1 | 7/2001 | Tamura et al. ............. 713/500 |
| 2002/0067787 A1 | 6/2002 | Naven et al. ................ 375/359 |
| 2002/0087820 A1 | 7/2002 | Garlepp et al. ............. 711/167 |
| 2003/0006817 A1 | 1/2003 | Seo et al. .................... 327/276 |
| 2003/0042957 A1 | 3/2003 | Tamura ....................... 327/233 |
| 2003/0043926 A1 | 3/2003 | Terashima et al. .......... 375/257 |
| 2003/0070037 A1* | 4/2003 | Manning .................... 711/105 |
| 2004/0046589 A1 | 3/2004 | Gauthier et al. ............. 326/93 |
| 2004/0052323 A1 | 3/2004 | Zhang ........................ 375/375 |
| 2004/0054845 A1 | 3/2004 | Ware et al. ................. 711/100 |
| 2004/0168036 A1 | 8/2004 | Garlepp et al. ............. 711/167 |
| 2004/0170072 A1 | 9/2004 | Ware et al. .................. 365/200 |
| 2004/0183559 A1 | 9/2004 | Ware et al. .................. 324/763 |
| 2004/0189363 A1 | 9/2004 | Takano ....................... 327/175 |
| 2005/0024117 A1 | 2/2005 | Kubo et al. ................. 327/258 |
| 2005/0033902 A1 | 2/2005 | Tamura ......................... 711/2 |
| 2005/0063163 A1 | 3/2005 | Hampel et al. ............. 361/728 |
| 2005/0073902 A1 | 4/2005 | D'Luna et al. ............. 365/233 |
| 2005/0129099 A1 | 6/2005 | Borker et al. ................ 375/220 |
| 2005/0134300 A1 | 6/2005 | Kushiyama et al. ........ 324/763 |
| 2005/0169097 A1 | 8/2005 | Ware et al. .................. 365/233 |
| 2005/0190193 A1 | 9/2005 | Freker et al. ................ 345/534 |
| 2005/0193290 A1 | 9/2005 | Cho et al. .................... 714/710 |
| 2006/0107126 A1* | 5/2006 | Almy et al. ................. 714/701 |

* cited by examiner

SYSTEM AND METHOD FOR VARYING TEST SIGNAL DURATIONS AND ASSERT TIMES FOR TESTING MEMORY DEVICES

TECHNICAL FIELD

This invention relates to testing memory devices, and, more particularly, to a system and method for precisely altering the time and duration that a signal, such as a memory command or address signal, is asserted.

BACKGROUND OF THE INVENTION

During the fabrication of integrated circuits such as memory devices, it is conventional to test such memory devices at several stages during the fabrication process. For example, memory devices are normally connected to a tester with a probe card when the memory devices are still in wafer form. In a final test occurring after the memory devices have been diced from the wafer and packaged, the memory devices are placed into sockets on a load board. The load board is then placed on a test head, typically by a robotic handler. The test head makes electrical contact with conductors on the load board that are connected to the memory devices. The test head is connected through a cable to a high-speed tester so that the tester can apply signals to and receive signals from the memory devices.

While the above-described testing environment works well in many applications, it is not without its limitations and disadvantages. One problem is the difficulty in testing various timing characteristics of memory devices, particularly at the high operating speeds for which such integrated circuits are designed. This difficulty is exacerbated by the relatively long cables that are used to connect the tester to the test head on which a load board containing the memory devices is mounted. However, it has been possible to overcome these difficulties by using complex, and hence very expensive, memory device testers that are able to independently control the assertion time and duration of each of the digital signals applied to the memory devices. A large number of testers are normally required for a high capacity fabrication plant, thus greatly increasing the cost of the plant and the manufacturing expense of memory devices.

One improved testing system that has been proposed is to fabricate an integrated test circuit that performs most if not all of the functions of conventional testers, and mount the integrated test circuit on the test head or load board containing the memory devices being tested. By placing the testing function on the test head or load board itself, the problems inherent in coupling test signals between a testing system and a test head are eliminated. Furthermore, since even custom integrated circuits can be fabricated relatively inexpensively, the cost of testing systems can be greatly reduced.

One difficulty in providing an integrated test circuit having the capability to test memory devices in this manner stems from the difficulty in accurately testing the ability of a memory device to operate correctly as the timing at which memory device signals, such as command and address signals and clock enable signals, are asserted is varied and the duration that such signals are asserted is varied. The timing and duration of these signals could be precisely varied if, like conventional testers, the integrated test circuit was able to independently control the assertion time and duration of each of the digital signals applied to the memory devices. However, it is presently not possible for an integrated test circuit to incorporate the level of complexity that would be required for it to operate in this manner.

Attempts have been made to provide a relatively simple testing system that precisely controls the assertion time and duration of digital signals applied to memory devices. One example of a conventional testing system 10 of this type is shown in FIG. 1. The testing system 10 includes a test signal generator 14 that stores and sequentially outputs sets of signals corresponding to memory commands and addresses. Each set of signals includes the same number of signals that are in a command or address applied to a memory device being tested. The test signal generator 14 may be implemented, for example, using a memory array operated by a microcontroller. The test signal generator 14 includes two output ports 16, 18 from which sets of tests signals corresponding to two commands or addresses are alternately transmitted. The signals are stored in the test signal generator 14 so that the logic levels of signals $S_1$ from the port 16 will be the valid command or address signals that are to be applied to a memory device being tested. The signals $S_2$ output from the port 18 are chosen to be either the compliment of the $S_1$ signals or the same as the $S_1$ signals depending on the operating mode of the testing system 10. The output ports 16, 18 are coupled through respective buses 22, 24 to respective signal input ports $I_1$, $I_2$ of a plurality of two-phase transmitters 20. Although only one phase transmitter 20 is shown for purposes of clarity, in actuality, one transmitter 20 is provided for each bit of a command and/or address for which a signal is to be output from the testing system 10. Each transmitter 20 also includes two clock ports $C_1$, $C_2$ and an output port Q.

In operation, the first signal input port $I_1$, is connected to the output port Q responsive to a rising edge of a clock signal $CLK_1$ applied to the $C_1$ port. Similarly, the second signal input port $I_2$ is connected to the output port Q responsive to a rising edge of a clock signal $CLK_2$ applied to the $C_2$ port. As a result, the $S_1$ signal is coupled to the output port Q at the rising edge of the $CLK_1$ signal and is isolated from the output port Q at the rising edge of the $CLK_2$ signal. Similarly, the $S_2$ signal is coupled to the output port Q at the rising edge of the $CLK_2$ signal and is isolated from the output port Q at the rising edge of the $CLK_1$ signal. Insofar as each of the valid command and address signals correspond to a respective one of the $S_1$ signals, the command or address signals start at the rising edge of the $CLK_1$ signal and terminate at the rising edge of the $CLK_2$ signal.

The clock signals $CLK_1$ and $CLK_2$ are generated at the output of a clock delay circuit 30, which receives an input clock signal $CLK_{IN}$. The clock delay circuit 30 includes two clock signal paths 34, 38, which generate the clock signals $CLK_1$ and $CLK_2$, respectively. The first signal path 34 includes a phase interpolator 40 and a clock distribution tree 44, which distributes the output of the interpolator 40 to respective transmitters 20 (it being remembered that a transmitter 20 is provided for each signal output from the testing system 10). As is well-known in the art, a phase interpolator produces a delayed signal from an input signal by interpolating between the phase of two input signals by a precisely controlled amount. The phase interpolator 40 receives the $CLK_{IN}$ signal and its complement $CLK_{IN}^*$. The degree of precision of the delay of a signal generated by a phase interpolator depends on the precision of the input signal frequency. The phase interpolator 40 can, for example, interpolate between the phases of the $CLK_{IN}$ and $CLK_{IN}^*$ signals in 100 increments. If the $CLK_{IN}$ and $CLK_{IN}^*$ signals have a frequency of 5 mHz, the delay of the $CLK_1$ signal can then be adjusted in 1 nanosecond increments. Each of the branches in the clock distribution tree 44 that receive the clock signal from the interpolator 40 includes a delay line 48 from which a respective $CLK_1$ signal is generated. The delays of the delay lines 48 are adjusted so that the signals corresponding to all bits of a command or address are applied to a memory device being tested at the same time. The delay lines 48 thus correct for bit-to-bit timing errors. Alternatively, the delays of the delay lines 48 may be adjusted so that the signals corresponding to groups of a command or address are applied to a memory device being tested at the same time.

The second clock signal path 38 is identical to the first clock signal path 26, and it therefore also includes a phase interpolator 50, clock distribution tree 54 and delay line 58.

Finally, the system 10 also includes a control circuit 60 for controlling the phase shift of the phase interpolator 40 and the respective delays provided by the delay lines 48, 58.

All of the command signals are sometimes referred to as a pin group, and all of the address signals are referred to as a different pin group. It is desirable for the assertion time and duration of the signals in the command pin group to be controlled independently of the control of the assertion time and duration of the signals in the address pin group. Therefore, one of the testing systems 10 is generally provided for the signals in the command pin group, and another of the testing systems 10 is provided for the signals in the address pin group. It is also possible to provide a testing system 10 for each of a large number of subsets of the pin groups.

The operation of the testing system 10 shown in FIG. 1 will now be explained with reference to the timing diagram shown in FIG. 2. The testing system 10 attempts to test the operation of a memory device by applying sets of command or address signals to the memory device that have an adjustable start time and an adjustable duration. As explained above, the command or address signals correspond to the $S_1$ signals, and the $S_2$ signals are either the same as or the compliment of the valid command or address signals.

The $CLK_{IN}$ signal applied to the inputs of the phase interpolators 40, 50 is shown in FIG. 2 along with the command or address signals $CA_{E1}$-$CA_{E6}$ output from the port 16 and the command or address signals $CA_{O1}$-$CA_{O6}$ output from the port 18. Two examples are shown in FIG. 2, namely an "A" example and a "B" example. In the "A" example, the phase interpolator 40 and the delay line 48 in the respective branch delay the $CLK_{IN}$ signal about one-quarter of the period of the $CLK_{IN}$ signal to produce the $C_{1A}$ signal. However, the phase interpolator 50 and the delay line 58 in the respective branch delay the $CLK_{IN}$ signal by a substantially greater amount to produce the $C_{2A}$ signal, which is delayed from the $CLK_{IN}$ signal by about an entire period of the $CLK_{IN}$ signal. As a result the $Q_A$ signals at the output of the transmitters 20 are equal to the $CA_{E1}$ signals responsive to the rising edge of the $C_{1A}$ signal at time $t_1$, and they are equal to the $CA_{O1}$ signals (which are the compliment of the $CA_{E1}$ signals) responsive to the rising edge of the $C_{2A}$ signal at time $t_4$. The $CA_E$ signals simulating a valid command or address thus have a duration that is almost as long as the period of the $CLK_{IN}$ signal. However, since the $C_{1A}$ signal is delayed by about one-quarter period of the $CLK_{IN}$ signal, the command or address does not become active until one-quarter period after the rising edge of the $CLK_{IN}$ signal. Therefore, in the "A" example, the delays of the phase interpolators 40, 50 and the delay lines 48, 58 are chosen so that the valid period of the command or address starts one-quarter period late and has a duration that is three-quarters of the maximum possible duration.

In the "B" example, the $C_{1B}$ signal is delayed from the $CLK_{IN}$ signal by half the period of the $CLK_{IN}$ signal, and the $C_{2B}$ signal is delayed from the $CLK_{IN}$ signal by three-quarters of the period of the $CLK_{IN}$ signal. As a result, the valid period of the command or address starts one-half period after the rising edge of the $CLK_{IN}$ signal, and it has a duration that is one-quarter of the maximum possible duration. By properly choosing the delays of the phase interpolators 40, 50 and the delay lines 48, 58, the commands and addresses can be applied to a memory device under test with any desired assertion time and duration.

Although the testing system 10 shown in FIG. 1 is able to output command and address signals with any desired assertion time and duration, it is still undesirably complex and it consumes a substantial amount of power, particularly since one of the transmitters 20 must be provided for each of a large number of command and address bits. Further, the need for two phase interpolators 40, 50 results in undesirable complexity and power consumption because conventional phase interpolators are complex and they consume a great deal of power. As a result, it may be impractical to incorporate the testing system 10 in an integrated test circuit.

There is therefore a need for a relatively simple testing system and method that is capable of precisely varying the assertion time and duration of memory devices signals, such as command signals, address signals and clock enable signals. A relatively simple testing system having these capabilities would make it highly practical to incorporate the system in an integrated test circuit that could be mounted on a load board or test head. Additionally, the system would make it possible to greatly reduce the cost of conventional memory device testers.

SUMMARY OF THE INVENTION

A system and method for providing at least one test signal having a controllable timing and duration includes a test signal generator operable to generate at least one test signal. The system also includes a phase interpolator receiving a periodic signal. The phase interpolator delays the periodic signal by a controllable phase shift, thereby providing a phase-shifted signal. The phase-shifted signal is provided to a delay line, which delays the phase-shifted signal by a delay value to provide a delayed signal. A signal transmitter is coupled to the phase interpolator and the delay line. The signal transmitter operates in a normal mode to output the at least one test signal responsive to transitions of both the phase-shifted signal and the delayed signal. In a signal duration test mode, the signal transmitter outputs the at least one test signal only responsive to transitions of the phase-shifted signal. In response to transitions of the delayed signal in the signal duration test mode, the signal transmitter outputs a signal other than the test signal. The at least one test signal may be, for example, a plurality of memory command signals, a plurality of memory address signals or a clock enable signal.

DETAILED DESCRIPTION

Figure 1:
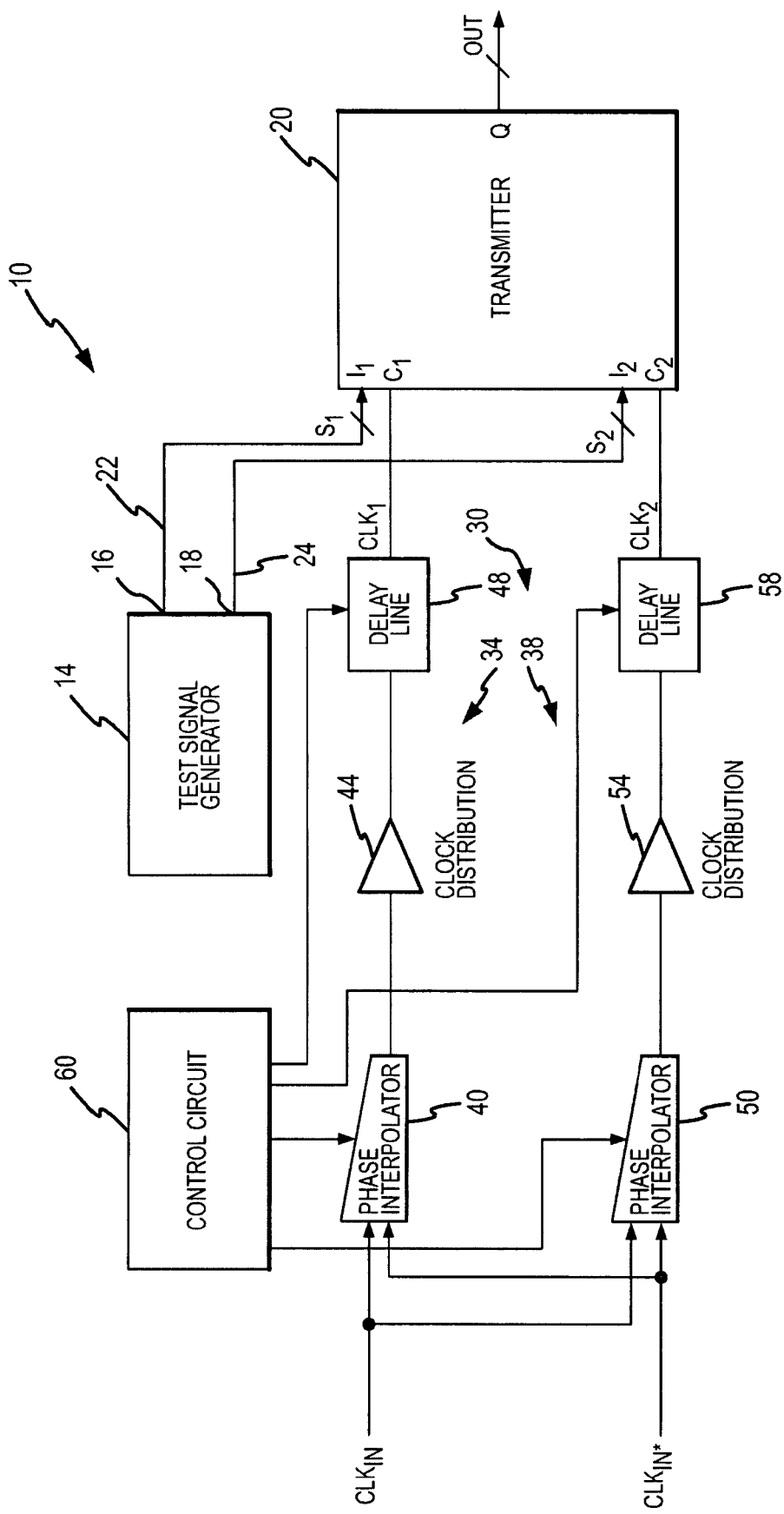
FIG. 1 is a block diagram of a conventional system for testing the timing margins of memory device command and address signals.
Figure 2:
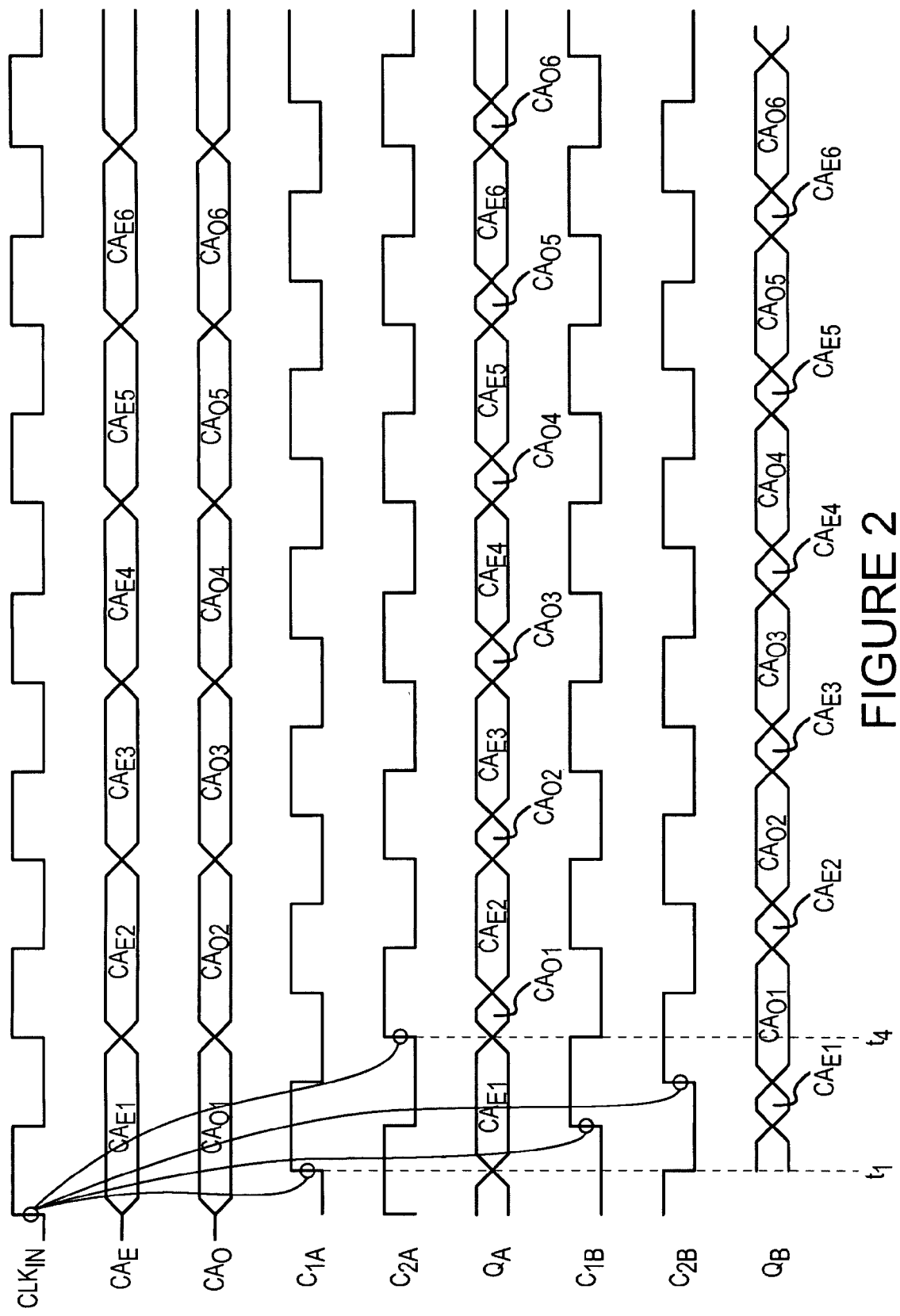
FIG. 2 is a timing diagram showing some of the digital signals that are present in the system of FIG. 1.
Figure 3:
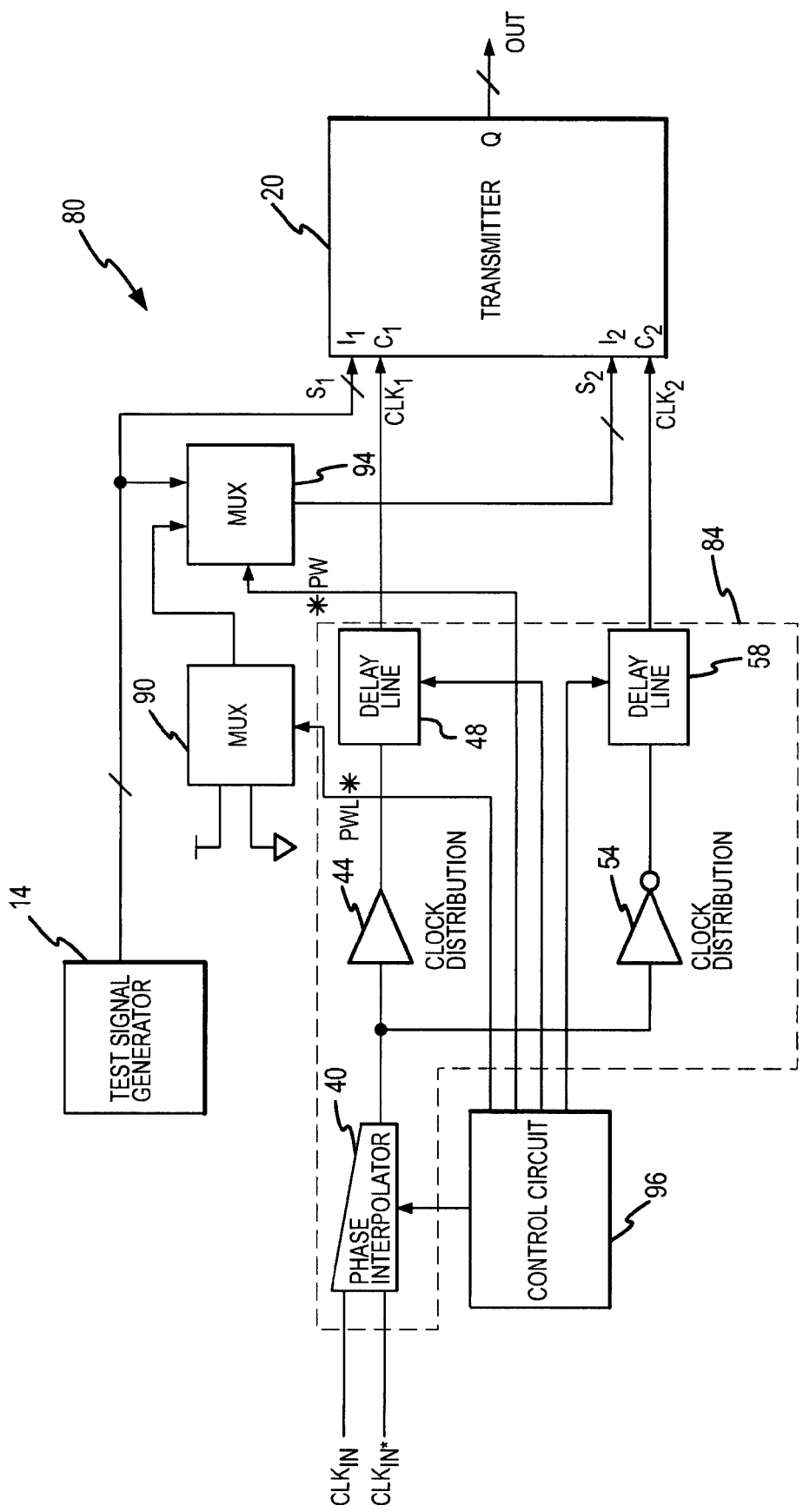
FIG. 3 is a block diagram of a system for testing the timing margins of memory device command and address signals according to one example of the invention.

A memory testing system 80 according to one example of the invention is illustrated in FIG. 3. The testing system 80 includes many of the same components that are used in the testing system 10 of FIG. 1. Therefore, in the interest of brevity, these components have been provided with the same reference numeral, and an explanation of their function and operation will not be repeated. The testing system 80 differs from the testing system 10 in several respects. Most significantly, it uses a clock delay circuit 84 having only a single phase interpolator 40, which is connected to both the first clock distribution tree 44 and delay line 48 and the second clock distribution tree 54 and delay line 58. As a result, the phase interpolator 40 affects the timing at which the rising edge of both the $CLK_1$ signal and the $CLK_2$ signal occurs. However, the delay lines 48, 58 are adjusted to vary the phase of the $CLK_1$ signal relative to the phase of the $CLK_2$ signal. As explained above with reference to FIGS. 1 and 2, the relative phases of the $CLK_1$ and $CLK_2$ signals determines the duration of the command and address signals that the transmitter 20 applies to a memory device being tested. Thus, the delay of the phase interpolator determines the timing of the command and address signals, and the delay of the delay line 48 relative to the delay of the delay line 58 determines the duration of the command and address signals. The use of a clock delay circuit 84 having only a single phase interpolator 40 provides the considerable advantage of eliminating the complexity and significant power consumption of providing multiple phase interpolators.

Although the clock distribution tree 54 is shown in FIG. 3 as being an inverting clock distribution tree, it may alternatively may be a non-inverting clock distribution tree, in which case the delay of the delay line 58 would be adjusted by half the period of the $CLK_{IN}$ signal. Also, the delay of the phase interpolator 40 alone can be adjusted to position the assertion time of a command or enable signal. As a result, the delay line 48 is not absolutely essential. However, the delay 48 is useful in compensating for the insertion delay of the delay line 58.

A second difference between memory the testing system 80 and the conventional testing system 10 is the ability to operate in either a normal operating mode or a timing margin test mode. This function is accomplished using multiplexers 90, 94 for providing the signals $S_1$, $S_2$ to the two-phase transmitter 20. One of the multiplexers 94 is provided for each of the transmitters 20 so that each of the command and address signals output from the test signal generator is coupled by the respective multiplexer 94 to the $I_1$ input of a respective transmitter 20. However, only one of the multiplexers 90 is required for the testing system 80, and the output of the multiplexer 90 is applied to the "B" inputs of all of the multiplexers 94.

Figure 4:
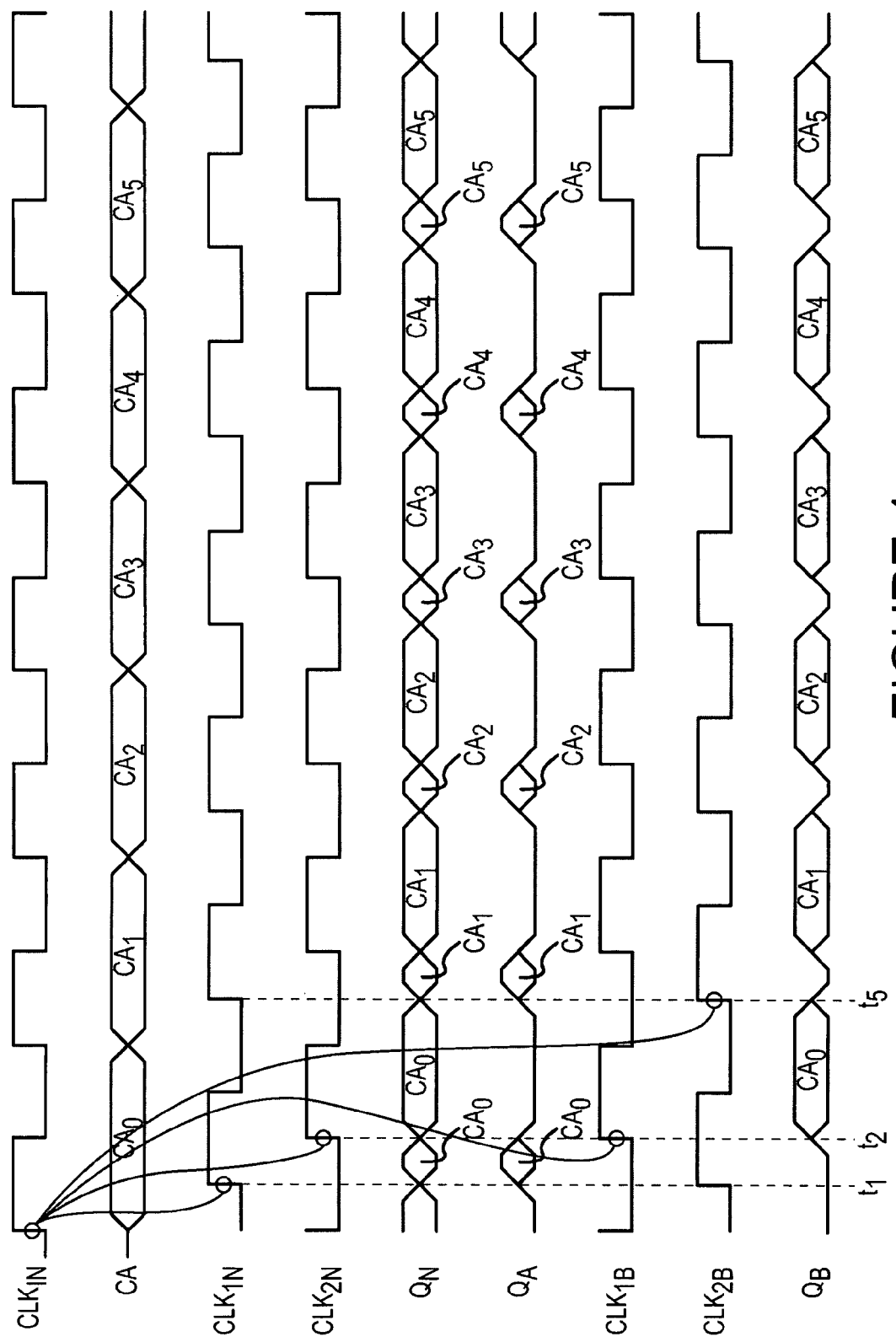
FIG. 4 is a timing diagram showing some of the digital signals that are present in the system of FIG. 3.

Unlike the testing system 10, the testing system 80 requires that the test signal generator 14 furnish only one of the signals $S_1$, $S_2$. In a normal operating mode, which is not used for testing the pulse-width margin of the command and address signals, the PW signal is inactive low, which causes the multiplexers 94 to couple the command or address signals from the test signal generator 14 to both the $I_1$ and $I_2$ inputs of the respective transmitters 20. As shown in FIG. 4, in the normal operating mode, the command or address signals are output from the test signals generator 14 coincident with the rising edges of the $CLK_{IN}$ signal, and they have a duration that extends for the full period of the $CLK_{IN}$ signal. As also shown in FIG. 4, the command or address signals are asserted on the rising edge of the $CLK_{1N}$ signal (which couples the $S_1$ signal to the Q output), and they are reasserted on the rising edge of the $CLK_{2N}$ signal (which couples the $S_2$ signal to the Q output). It can be seen from FIG. 4 that, in the normal operating mode, the command and address signals $Q_N$ become valid on the rising edge of the $CLK_{IN}$ signal, and they have a duration equal to the full period of the $CLK_{IN}$ signal. Therefore, in the normal operating mode, the only effect of the delays provided by the phase interpolator 40 and the delay line 48 are to adjust the timing of the command and address signals, and delay of the delay line 58 has no effect on the command and address signals.

In an alternative example of the invention, the test signal generator 14 can furnish the $S_1$ signals as well as an $S_2$ signal, which would allow the multiplexer 94 to be omitted. However, this test system would require more circuitry than the test system 80 using the multiplexer 94.

In the pulse-width margin testing mode, the PW signal is active high so that the command or address signals from the test signal generator 14 are coupled only to the $I_1$ inputs of the two-phase transmitters 20. The $I_2$ inputs of the transmitters 20 are coupled to the outputs of the respective multiplexers 90, which are controlled by a pulse-width low "PWL*" signal. The PWL* signal is initially active low, thereby causing the multiplexer 90 to couple a logic low to the "B" input of the multiplexer 94, which, in turn, couples the logic low to the $I_2$ inputs of the transmitters 20.

The PW signal and the PWL* signal, as well as signals for controlling the phase interpolator 40 and the delay lines 48, 58, are generated by a control circuit 96.

The operation of the testing system 80 in this configuration is also shown in FIG. 4 for two examples. In the first example, the $CLK_1$ and $CLK_2$ signals are identical to the $CLK_{1N}$ and $CLK_2N$ signals shown for operation in the normal operating mode. At time $t_1$, the transmitters 20 couple the outputs of the test signal generator 14 to the Q outputs responsive to the rising edge of the $CLK_{1N}$ signal. However, a short time later at $t_2$, the transmitters 20 couple the low output from the multiplexer 90 to the Q outputs responsive to the rising edge of the $CLK_{2N}$ signal. The Q output then stays low until $t_5$ when the $CLK_{1N}$ signal again transitions high. It can be seen from FIG. 4 that the command or address signals output from the testing system 80 are delayed from the $CLK_{IN}$ signal by one-quarter period of the $CLK_{IN}$ signal, which corresponds to the combined delays of the phase interpolator 40 and the delay line 48. It can also be seen that the command or address signals have a duration that is equal to one-quarter of the period of the $CLK_{IN}$ signal, which corresponds to the delay of the delay line 58 that is greater than the delay of the delay line 48.

In a second example, the delay of the phase interpolator 40 and the delay line 48 are set so that the $CLK_{1B}$ signal is delayed from the $CLK_{IN}$ signal by one-half period of the $CLK_{IN}$ signal. Additionally, the delay of the delay line 58 is set so that the $CLK_{2B}$ signal is delayed from the $CLK_{IN}$ signal by one and one-quarter period of the $CLK_{IN}$ signal. As a result, the command or address signals are asserted with a delay of one-half period of the $CLK_{IN}$ signal, and they have a duration that is equal to three-quarters of the period of the $CLK_{IN}$ signal.

Some of the command or address signals output from the test signal generator 14 will have a low logic level. Therefore, these signals will not terminate responsive to the rising edge of the $CLK_2$ signal. The test procedure described above is therefore repeated with the PWL* signal inactive high. The multiplexer 90 then couples a high logic level to the $I_2$ inputs of the transmitters 20 through the multiplexers 94. As a result, the command or address signals are identical to the signals $Q_A$ and $Q_B$ except that the signals are high rather than low when the command or address signals are not being asserted.

The memory testing system 80 can also be adapted to test the timing margins of other memory device signals, such as clock enable signals. As is well-known in the art, an active low clock enable ("CKE*") signal is applied to a synchronous memory device to allow an externally applied clock signal to be coupled to circuits within the memory device. Memory device specifications require that the CKE* signal be asserted synchronously within a specified timing margin of a rising edge of the clock signal. Deassertion of the CKE* signal may, however, be asynchronous. During the testing of memory devices, it is important to test the timing margin of the CKE* signal to ensure the memory device will operate if the CKE* signal is anywhere within the specified timing margin.

Figure 5:
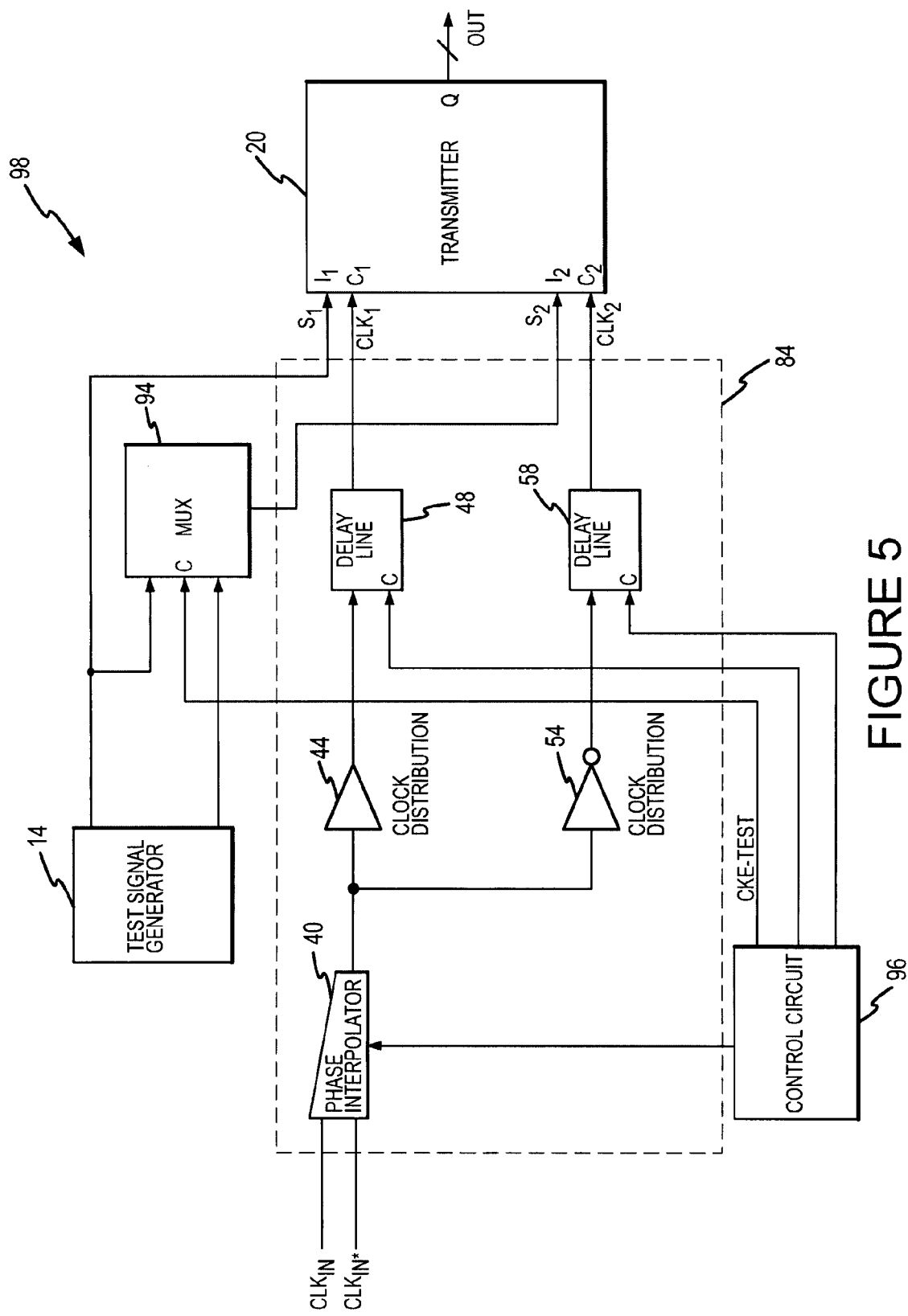
FIG. 5 is a block diagram of a system for testing the timing margin of a clock enable signal according to one example of the invention.

Testing of the CKE* timing margin may be accomplished using a testing system 98 shown in FIG. 5. This system is somewhat similar to the system 80 of FIG. 3, and it uses many of the same components operating in the same manner. Therefore, in the interests of brevity, these components have been provided with the same reference numerals, and an explanation of the function and operation will not be repeated. As with the testing system 80, the delay of the phase interpolator 40 alone can be adjusted to position the assertion time of the CKE* signal. As a result, the delay line 48 is not absolutely essential. However, the delay 48 is useful in compensating for the insertion delay of the delay line 58. For this same reason, although the clock distribution trees 44, 54 are not essential (since only one signal is distributed through each branch), the drivers used in the trees 44, 54 compensate for delays in the clock distribution trees 44, 54 in the testing system 80 when both systems 80, 98 are used in the same testing system.

In normal operation, the CKE-TEST signal from the control circuit 96 is inactive low, thereby causing the multiplexer 94 to apply the $CKE*_{EVEN}$ signal from the test signal generator to both the $I_1$ and $I_2$ inputs of the transmitter 20. Therefore, during normal testing, the $CKE*_{EVEN}$ signal is used as the CKE* signal, and the $CKE*_{ODD}$ signal at the output of the test signal generator 20 is not used.

Figure 6:
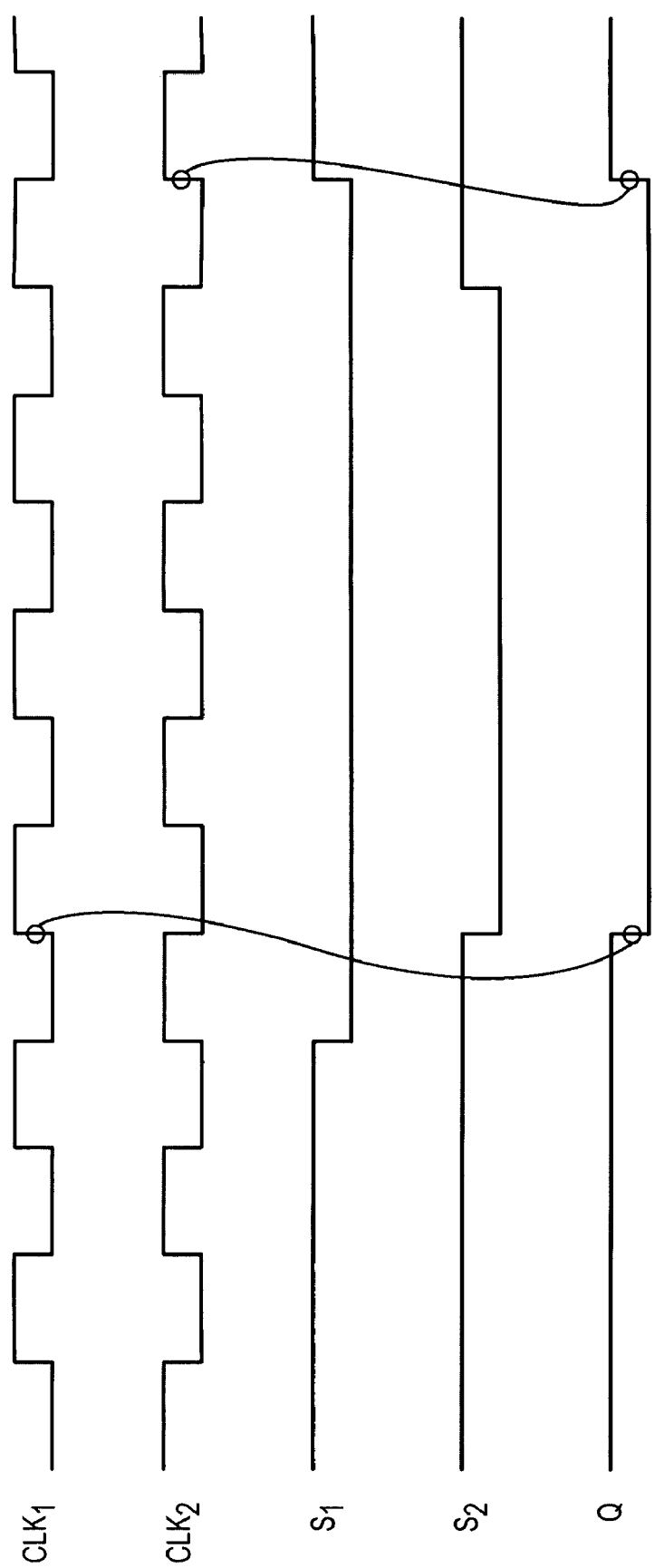
FIG. 6 is a timing diagram showing some of the digital signals that are present in the system of FIG. 5.

When the timing margin of the CKE* signal is to be tested, the CKE-TEST is driven active high, thereby causing the multiplexer 94 to couple the $CKE*_{ODD}$ signal to the $I_2$ input of the transmitter 20. As shown in FIG. 6, prior to the CKE*OUT signal transitioning active low, the test signal generator 14 outputs a low $CKE*_{EVEN}$ signal. Prior to the $CKE*_{OUT}$ signal transitioning inactive high, the test signal generator 14 outputs a high $CKE*_{ODD}$ signal. On the next rising edge of the $CLK_1$ signal after the $CKE*_{EVEN}$ signal transitions low, the low $CKE*_{EVEN}$ signal is coupled to the output of the transmitter 20. As a result, the transmitter 20 applies a low $CKE*_{OUT}$ signal to the CKE* input of a memory device being tested. The timing at which the $CKE*_{OUT}$ signal transitions low can be adjusted by adjusting the delays of the phase interpolator 40 and the delay line 48.

The $CLK*_{OUT}$ signal remains low until the first rising edge of the $CLK_2$ signal after the $CKE*_{ODD}$ signal transitions high. As shown in FIG. 6, the high $CKE*_{ODD}$ signal is then coupled through the transmitter 20 to make the $CKE*_{OUT}$ signal inactive high. The timing at which the $CKE*_{OUT}$ signal is driven high can be controlled if desired by adjusting the delay of the delay line 58.

Figure 7:
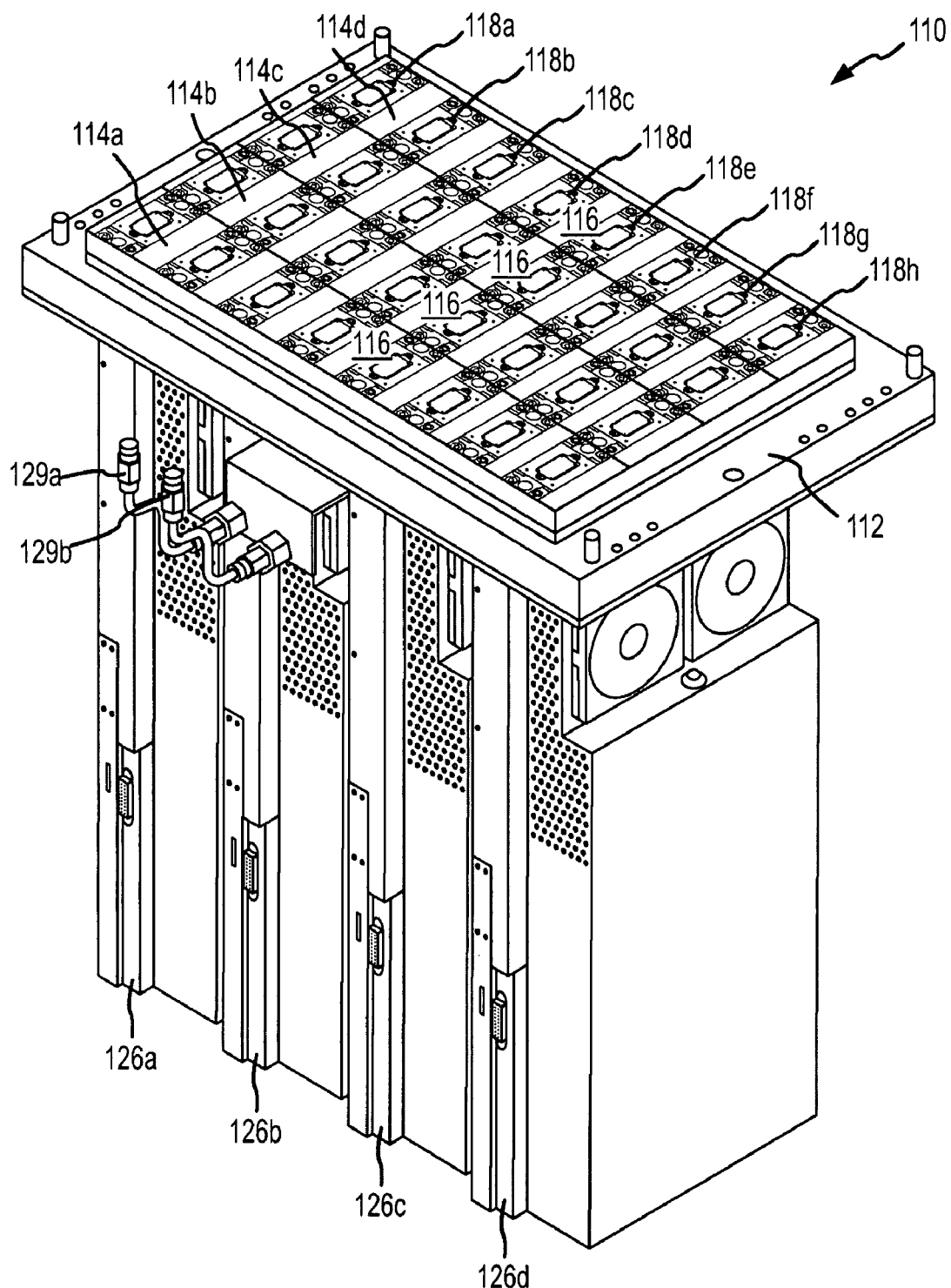
FIG. 7 is an isometric view of a test system including one or both of the testing systems of FIGS. 3 and 5 or some other example of the invention.

Any or all of the memory device testing systems 80, 98 may be incorporated in a test system of the type shown in FIG. 7. The test system 100 includes a test head 112 on which several load boards 114a-d are placed. Each of the load boards 114a-d have a printed circuit substrate 116 on which several integrated circuit sockets 118a-h are mounted. Each of the integrated circuit sockets 118a-h receives a respective integrated circuit (not shown in FIG. 7). In the example shown in FIG. 7, the sockets 118a-h are adapted to receive integrated circuit memory devices, such as dynamic random access memory ("DRAM") devices. Prior to final testing of the integrated circuits, an integrated circuit handler loads an integrated circuit into each of the sockets 118a-h, and then places each of the load boards 114a-d on the test head 112.

Figure 8A:
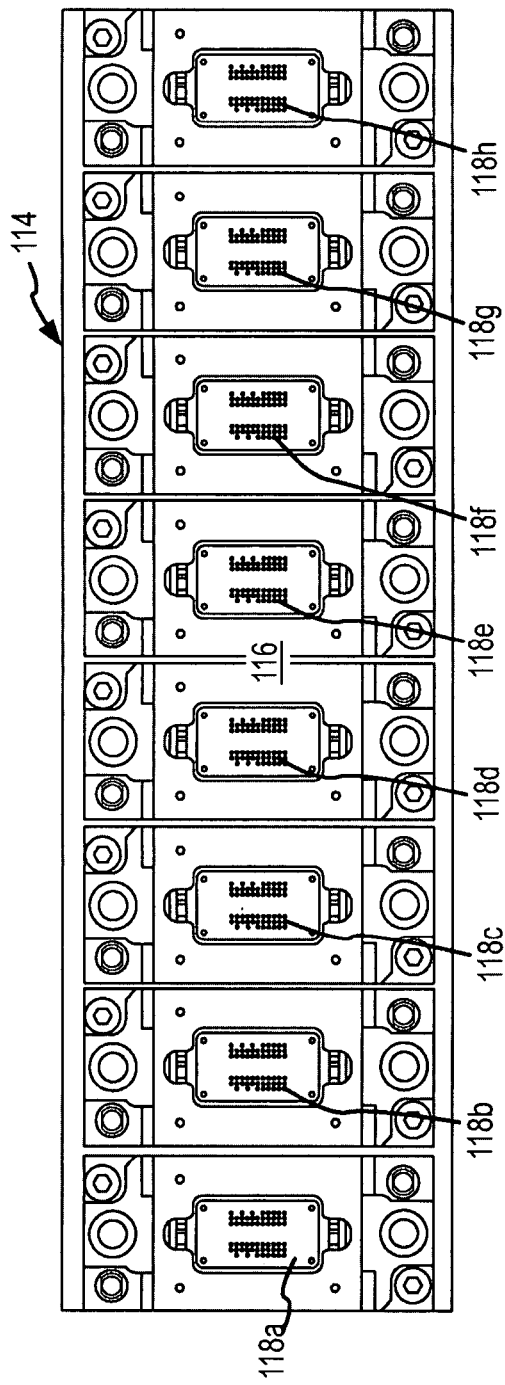
FIGS. 8A and 8B are top and bottom plan views, respectively, of a load board used in the test system of FIG. 7.
Figure 8B:
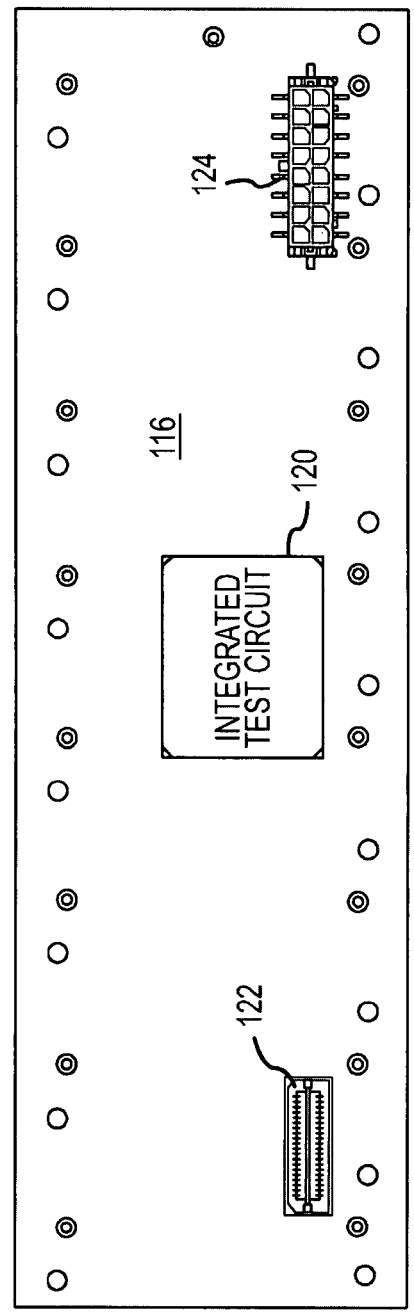

As explained in greater detail below, each of the load boards 114a-d includes an integrated test chip (not shown in FIG. 7) mounted on the surface of the substrate 116 opposite the surface on which the sockets 118a-h are mounted. The sockets 118a-h are shown mounted on the upper surface of the substrate 116 in greater detail in FIG. 8A. The lower surface of the substrate 116 is shown in FIG. 8B. An integrated test circuit 120 is mounted at the center of the substrate 116, and it is connected to the sockets 118a-h through conventional printed circuit traces (not shown in FIG. 8B). Also mounted on the lower surface of the substrate 116 are a conventional JTAG connector 122 and a power supply connector 124. High-level test commands are applied to the test circuit 120 through the JTAG connector 122, and high-level results data are received from the test circuit 120 through the JTAG connector 122. Power is applied to the test circuit 120 as well as to integrated circuits mounted in the sockets 118a-h through the power supply connector 124.

The integrated test circuit 120 includes a number of testing systems, including either or both of the testing systems 80, 98 or a testing system according to some other example of the invention. These testing systems 80, 98 used in the integrated test circuit 120 operate as described above with reference to FIGS. 3-6. More specifically, the integrated test circuit 120 applies a pattern of test signals to the memory devices mounted in the sockets 118a-h. These test signals simulate memory command, address and write data signals, including command and address signals that have their timing and duration altered as explained above. The test circuit 120 then receives signals from the memory devices indicative of the memory devices' response to the pattern of signals. Insofar as the integrated test circuit 120 is mounted on the same substrate 116 as the memory devices, the timing at which the pattern of signals are applied to the memory devices can be more precisely controlled. Furthermore, the relatively short length of the conductors extending from the integrated test circuit 120 to the memory devices in the sockets 118a-h allows the circuitry in the integrated test circuit 120 to be less complex and therefore less expensive than with testers in which a pattern of test signals is applied through a long cable.

With further reference to FIG. 7, the test head 112 is mounted on the upper ends of several power supplies 126a-d, which generate DC supply voltages at respective magnitudes for use by the test head 112 and the load boards 114a-d. As mentioned above, the DC supply voltages are applied to the test head 112 through the power supply connector 124 (FIG. 8B). The test head 112 also includes fluid couplings 129a,b that receive and discharge a cooling fluid, respectively, for maintaining the temperature of the test circuit 120 at a stable acceptably cool temperature.

Although the present invention has been described with reference to the disclosed examples, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A system for providing at least one test signal having a controllable timing and duration, the system comprising:
   a test signal generator operable to generate at least one test signal;
   a phase interpolator coupled to receive a periodic signal, the phase interpolator being operable to phase shift the periodic signal by a magnitude corresponding to a phase value to generate a phase-shifted signal;
   a first clock distribution tree having an input coupled to receive the phase-shifted signal from the phase interpolator, the first clock distribution tree distributing the phase-shifted signal through a plurality of branches of the tree to generate at an output of each branch a respective first delayed clock signal;
   a second clock distribution tree having an input coupled to receive the phase-shifted signal from the phase interpolator, the second clock distribution tree distributing the phase-shifted signal through a plurality of branches of the tree to generate at an output of each branch a respective second delayed clock signal;
   a delay line in each branch of the second clock distribution tree, the delay line delaying the phase-shifted signal being coupled through the second clock distribution tree by a delay value so that the second delay clock signal is delayed relative to the periodic signal by a delay equal to the sum of the delay of the phase interpolator and the delay of the delay line;
   at least one signal routing device having a first input coupled to receive at least one respective test signal from the test signal generator and having a second input, the at least one signal routing device being operable responsive to receiving a first mode signal to couple the at least one respective test signal to an output and to couple a signal applied to the second input to the output responsive to receiving a second mode signal;
   at least one transmitter having a first data input coupled to receive a respective test signal from the test signal generator and a second data input coupled to the output of a respective signal routing device, the at least one transmitter having first and second clock inputs coupled to receive the first and second delayed clock signals from the first and second clock distribution trees, respectively, the at least one transmitter being operable to couple the first data input to an output responsive to a transition of the first delayed clock signal applied to the first clock input, the at least one transmitter further being operable to couple the second data input to the output responsive to a transition of the second delayed clock signal applied to the second clock input; and
   a control circuit coupled to the delay line, the phase interpolator, and the at least one signal routing device, the control unit being operable to apply the phase value to the phase interpolator and the delay value to the delay line to adjust the timing and duration of each test signal coupled to the output of the respective at least one transmitter.

2. The system of claim 1 wherein the control circuit is operable to apply the first mode signal to the at least one signal routing device in a normal testing mode and is operable to apply the second mode signal to the at least one signal routing device in a signal duration test mode.

3. The system of claim 1 wherein test signal generator is operable to generate a plurality of test signals.

4. The system of claim 3 wherein the test signals comprise memory command signals.

5. The system of claim 3 wherein the test signals comprise memory address signals.

6. The system of claim 1 wherein the at least one test signal provided by the test signal generator comprises a clock enable signal.

7. The system of claim 1, further comprising a second delay line in each branch of the first clock distribution tree, the second delay line delaying the phase-shifted signal being coupled through the first clock distribution tree by a second delay value so that the first delayed clock signal is delayed relative to the periodic signal by a delay equal to the sum of the delay of the phase interpolator and the delay of the second delay line, and wherein the control circuit is coupled to the second delay line to provide the second delay value to the second delay line.

8. The system of claim 1 wherein the at least one signal routing device comprises at least one multiplexer.

9. The system of claim 1 wherein the at least one signal applied to the second input of the at least one signal routing device comprises at least one static logic level.

10. The system of claim 1, further comprising a second signal routing device having a first input coupled to receive a first logic level, a second input coupled to receive a second logic level, and an output coupled to the second input of the first signal routing device, the second signal routing device having a control input coupled to receive a control signal from the control circuit.

11. A system for providing at least one test signal having a controllable timing and duration, comprising:
   a test signal generator operable to generate at least one test signal;
   a phase interpolator receiving a periodic signal and delaying the periodic signal by phase shifting the periodic signal by a controllable a phase shift, thereby providing a phase-shifted signal;
   a delay line coupled to receive the phase-shifted signal from the phase interpolator, the delay line being operable to delay the phase-shifted signal by a delay value, thereby providing a delayed signal; and
   a signal transmitter coupled to the phase interpolator and the delay line, the signal transmitter being operable in a normal mode to output the at least one test signal responsive to transitions of the phase-shifted signal and responsive to transitions of the delayed signal, the signal transmitter being operable in a signal duration test mode to output the at least one test signal responsive to transitions of the phase-shifted signal and to output a signal other than the test signal responsive to transitions of the delayed signal.

12. The system of claim 11 wherein test signal generator is operable to generate at a plurality of test signals.

13. The system of claim 12 wherein the test signals comprise memory command signals.

14. The system of claim 12 wherein the test signals comprise memory address signals.

15. The system of claim 11 wherein the at least one test signal provided by the test signal generator comprises a clock enable signal.

16. The system of claim 11, further comprising a second delay line delaying the phase-shifted signal from the phase interpolator before the phase-shifted signal is applied to the phase interpolator so that the signal transmitter is operable in a normal mode to output the at least one test signal responsive to transitions of the phase-shifted signal after being delayed by the second delay line and responsive to transitions of the delayed signal, the signal transmitter being operable in a signal duration test mode to output the at least one test signal responsive to transitions of the phase-shifted signal after being delayed by the second delay line and to output a signal other than the test signal responsive to transitions of the delayed signal.

17. An integrated circuit load board, comprising:
a substrate;
a plurality of integrated circuit sockets mounted on the substrate; and
an integrated test circuit mounted on the substrate and coupled to the integrated circuit sockets, the integrated test circuit comprising:
a test signal generator operable to generate at least one test signal;
a phase interpolator coupled to receive a periodic signal, the phase interpolator being operable to phase shift the periodic signal by a magnitude corresponding to a phase value to generate a phase-shifted signal;
a first clock distribution tree having an input coupled to receive the phase-shifted signal from the phase interpolator, the first clock distribution tree distributing the phase-shifted signal through a plurality of branches of the tree to generate at an output of each branch a respective first delayed clock signal;
a second clock distribution tree having an input coupled to receive the phase-shifted signal from the phase interpolator, the second clock distribution tree distributing the phase-shifted signal through a plurality of branches of the tree to generate at an output of each branch a respective second delayed clock signal;
a delay line in each branch of the second clock distribution tree, the delay line delaying the phase-shifted signal being coupled through the second clock distribution tree by a delay value so that the second delay clock signal is delayed relative to the periodic signal by a delay equal to the sum of the delay of the phase interpolator and the delay of the delay line;
at least one signal routing device having a first input coupled to receive at least one respective test signal from the test signal generator and having a second input, the at least one signal routing device receiving a mode signal and being operable responsive to the mode signal to couple the at least one respective test signal to an output responsive to a first mode signal and to couple a signal applied to the second input to the output responsive to a second mode signal;
at least one transmitter having a first data input coupled to receive a respective test signal from the test signal generator and a second data input coupled to the output of a respective signal routing device, the at least one transmitter having first and second clock inputs coupled to receive the first and second delayed clock signals from the first and second clock distribution trees, respectively, the at least one transmitter being operable to couple the first data input to an output responsive to a transition of the first delayed clock signal applied to the first clock input, the at least one transmitter further being operable to couple the second data input to the output responsive to a transition of the second delayed clock signal applied to the second clock input; and
a control circuit coupled to the delay line, the phase interpolator, and the at least one signal routing device, the control unit being operable to apply the phase value to the phase interpolator and the delay value to the delay line to adjust the timing and duration of each test signal coupled to the output of the respective at least one transmitter.

18. The integrated circuit load board of claim 17 wherein the control circuit is operable to apply the first mode signal to the at least one signal routing device in a normal testing mode and is operable to apply the second mode signal to the at least one signal routing device in a signal duration test mode.

19. The integrated circuit load board of claim 17 wherein test signal generator is operable to generate at a plurality of test signals.

20. The integrated circuit load board of claim 19 wherein the test signals comprise memory command signals.

21. The integrated circuit load board of claim 19 wherein the test signals comprise memory address signals.

22. The integrated circuit load board of claim 17 wherein the at least one test signal provided by the test signal generator comprises a clock enable signal.

23. The integrated circuit load board of claim 17, further comprising a second delay line in each branch of the first clock distribution tree, the second delay line delaying the phase-shifted signal being coupled through the first clock distribution tree by a second delay value so that the first delayed clock signal is delayed relative to the periodic signal by a delay equal to the sum of the delay of the phase interpolator and the delay of the second delay line, and wherein the control circuit is coupled to the second delay line to provide the second delay value to the second delay line.

24. The integrated circuit load board of claim 17 wherein the at least one signal routing device comprises at least one multiplexer.

25. The integrated circuit load board of claim 17 wherein the at least one signal applied to the second input of the at least one signal routing device comprises at least one static logic level.

26. The integrated circuit load board of claim 17, further comprising a second signal routing device having a first input coupled to receive a first logic level, a second input coupled to receive a second logic level, and an output coupled to the second input of the first signal routing device, the second signal routing device having a control input coupled to receive a control signal from the control circuit.

27. The integrated circuit load board of claim 17, further comprising a respective integrated circuit in each of the integrated circuit sockets in communication with the integrated test circuit.

28. The integrated circuit load board of claim 27 wherein each of the integrated circuits comprise a dynamic random access memory device.

29. A method of providing at least one test signal having a controllable timing and duration, comprising:

generating at least one test signal;

providing a periodic signal;

delaying the periodic signal by phase shifting the periodic signal by a controllable phase shift, thereby providing a phase-shifted signal;

delaying the phase-shifted signal by a delay value, thereby providing a delayed signal;

in a normal testing operating mode, outputting the at least one test signal responsive to transitions of the phase-shifted signal and responsive to transitions of the delayed signal; and in a signal duration test mode, outputting the at least one test signal responsive to transitions of the phase-shifted signal and outputting a signal other than the at least one test signal responsive to transitions of the delayed signal.

30. The method of claim 29 wherein the act of generating at least one test signal comprises generating a plurality of test signals.

31. The method of claim 30 wherein the act of generating a plurality of test signals comprises generating memory command signals.

32. The method of claim 30 wherein the act of generating a plurality of test signals comprises generating memory address signals.

33. The method of claim 30 wherein the act of generating at least one test signal comprises generating a clock enable signal.

34. The method of claim 29 wherein the act of outputting the at least one test signal responsive to transitions of the phase-shifted signal comprising outputting the at least one test signal responsive to transitions of the phase-shifted signal after the phase-shifted signal has been delayed by a second delay value.

* * * * *

UNITED STATES PATENT AND TRADEMARK OFFICE
CERTIFICATE OF CORRECTION

PATENT NO. : 7,366,966 B2
APPLICATION NO. : 11/248724
DATED : April 29, 2008
INVENTOR(S) : LeBerge It is certified that error appears in the above-identified patent and that said Letters Patent is hereby corrected as shown below:

On the Title page, in field (75), in "Inventor", in column 1, line 1, delete "LeBerge," and insert -- LaBerge, --, therefor.

In column 10, line 54, in Claim 11, after "controllable" delete "a".

In column 12, line 27, in Claim 19, after "generate" delete "at".

Signed and Sealed this

Twenty-ninth Day of July, 2008

JON W. DUDAS
*Director of the United States Patent and Trademark Office*